(12) United States Patent
Cheon et al.

(10) Patent No.: US 12,381,067 B2
(45) Date of Patent: Aug. 5, 2025

(54) SUBSTRATE PROCESSING APPARATUS

(71) Applicant: JUSUNG ENGINEERING CO., LTD., Gwangju-si (KR)

(72) Inventors: Min Ho Cheon, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 476 days.

(21) Appl. No.: 17/911,416

(22) PCT Filed: May 4, 2021

(86) PCT No.: PCT/KR2021/005577
§ 371 (c)(1),
(2) Date: Sep. 13, 2022

(87) PCT Pub. No.: WO2021/235739
PCT Pub. Date: Nov. 25, 2021

(65) Prior Publication Data
US 2023/0104088 A1    Apr. 6, 2023

(30) Foreign Application Priority Data
May 19, 2020    (KR) .................... 10-2020-0059687

(51) Int. Cl.
*H01J 37/32* (2006.01)

(52) U.S. Cl.
CPC .. *H01J 37/32568* (2013.01); *H01J 37/32165* (2013.01); *H01J 37/3244* (2013.01);
(Continued)

(58) Field of Classification Search
CPC ........... H01J 37/32568; H01J 37/32165; H01J 37/3244; H01J 37/32541; H01J 37/32577;
(Continued)

(56) References Cited

U.S. PATENT DOCUMENTS

| | | | | |
|---|---|---|---|---|
| 2011/0159183 A1* | 6/2011 | Jin | ........................ | C23C 16/303 |
| | | | | 118/712 |
| 2014/0007812 A1* | 1/2014 | Chang | ................ | H01J 37/32541 |
| | | | | 315/111.21 |
| 2014/0373783 A1* | 12/2014 | Sawada | ............. | H01J 37/32091 |
| | | | | 118/723 R |

FOREIGN PATENT DOCUMENTS

| | | | |
|---|---|---|---|
| JP | 2008060258 A | | 3/2008 |
| JP | 5902896 B2 | | 4/2016 |

(Continued)

OTHER PUBLICATIONS

International Search Report for PCT/KR2021/005577 mailed Aug. 26, 2021.

*Primary Examiner* — Yuechuan Yu
(74) *Attorney, Agent, or Firm* — Renaissance IP Law Group LLP

(57) ABSTRACT

The present inventive concept relates to a substrate processing apparatus comprising: a chamber; a substrate support part which supports one or more substrates in the chamber; an upper electrode which is disposed above and arranged opposite to the substrate support part; and a lower electrode which is disposed below and spaced apart from the upper electrode, wherein the lower electrode includes a first electrode to which first RF power having a first frequency is applied and a second electrode to which second RF power having a second frequency different from the first frequency is applied.

12 Claims, 7 Drawing Sheets

(52) U.S. Cl.
CPC .. *H01J 37/32541* (2013.01); *H01J 37/32577* (2013.01); *H01J 37/32715* (2013.01); *H01J 2237/332* (2013.01); *H01J 2237/334* (2013.01)

(58) Field of Classification Search
CPC ........... H01J 37/32715; H01J 2237/332; H01J 2237/334
See application file for complete search history.

(56) References Cited

FOREIGN PATENT DOCUMENTS

| | | | | |
|---|---|---|---|---|
| KR | 2010025699 A | * | 3/2010 | ........ H01J 37/32091 |
| KR | 20120113875 A | | 10/2012 | |
| KR | 101463934 B1 | | 11/2014 | |
| KR | 101497413 B1 | | 3/2015 | |
| KR | 20190051929 A | | 5/2019 | |
| TW | 201947640 A | | 12/2019 | |
| WO | 2017169556 A1 | | 10/2017 | |

* cited by examiner

SUBSTRATE PROCESSING APPARATUS

TECHNICAL FIELD

The present inventive concept relates to a substrate processing apparatus which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed on a substrate, and examples of the processing process include a deposition process of depositing a thin film including a specific material on the substrate, a photo process of selectively exposing a portion of a thin film by using a photosensitive material, an etching process of removing the selectively exposed portion of the thin film to form a pattern, etc. Such a processing process is performed on a substrate by a substrate processing apparatus.

A substrate processing apparatus according to the related art includes a substrate supporting part and a gas injection unit which injects a processing gas toward the substrate supporting part. The substrate processing apparatus according to the related art injects a gas in a state where a radio frequency (RF) power having one predetermined frequency is applied to the gas injection unit, and thus, may perform a processing process on the substrate.

Here, in a case where the substrate processing apparatus according to the related art performs the processing process on the substrate in only a state where an RF power having a high frequency is applied to the gas injection unit, a step coverage of a thin film deposited on the substrate is enhanced, but there is a problem where a dense degree of the thin film deposited on the substrate is reduced.

Moreover, in a case where the substrate processing apparatus according to the related art performs the processing process on the substrate in only a state where an RF power having a low frequency is applied to the gas injection unit, a dense degree of the thin film deposited on the substrate is enhanced, but there is a problem where a step coverage of the thin film deposited on the substrate is reduced.

As described above, the substrate processing apparatus according to the related art has a problem where it is difficult to enhance the quality of a substrate on which the processing process is completed.

DISCLOSURE

Technical Problem

The present inventive concept is devised to solve the above-described problem and is for providing substrate processing apparatuses for enhancing the quality of a substrate on which a processing process is completed.

Technical Solution

To accomplish the above-described objects, the present inventive concept may include the following elements.

A substrate processing apparatus according to the present inventive concept may include: a chamber; a substrate supporting part supporting one or more substrates in the chamber; an upper electrode disposed over the substrate supporting part so as to be opposite to the substrate supporting part; and a lower electrode disposed under the upper electrode so as to be apart from the upper electrode. The upper electrode may inject a first gas through a first gas flow path and injects a second gas through a second gas flow path spatially apart from the first gas flow path. The lower electrode may include: a first electrode to which a first RF power having a first frequency is applied; and a second electrode to which a second RF power having a second frequency differing from the first frequency is applied.

A substrate processing apparatus according to the present inventive concept may include: a chamber; a substrate supporting part supporting one or more substrates in the chamber; a gas injection unit disposed over the substrate supporting part so as to be opposite to the substrate supporting part; and a power application unit for applying an RF power. The gas injection unit may include an upper electrode including a first gas flow path and a second gas flow path spatially apart from each other, and a lower electrode disposed between the upper electrode and the substrate supporting part. The lower electrode may include a first electrode and a second electrode disposed under the upper electrode. The power application unit may include a first application mechanism connected to the first electrode to apply a first RF power having a first frequency to the first electrode, and a second application mechanism connected to the second electrode to apply a second RF power having a second frequency to the second electrode.

Advantageous Effect

According to the present inventive concept, the following effects can be obtained.

The present inventive concept is implemented to perform a processing process on a substrate by using RF powers having different frequencies. Accordingly, the present inventive concept may enhance the quality of a substrate on which a processing process is completed.

The present inventive concept is implemented to decrease a stress applied to a substrate in a process of performing a processing process on a substrate. Accordingly, the present inventive concept may decrease a bending deformation of a substrate on which a processing process is completed, thereby more enhancing the quality of a substrate on which a processing process is completed.

DESCRIPTION OF DRAWINGS

FIGS. 5 and 6 are schematic side cross-sectional views of an upper electrode and a lower electrode with respect to line I-I of FIG. 4.

MODE FOR INVENTION

Figure 1:
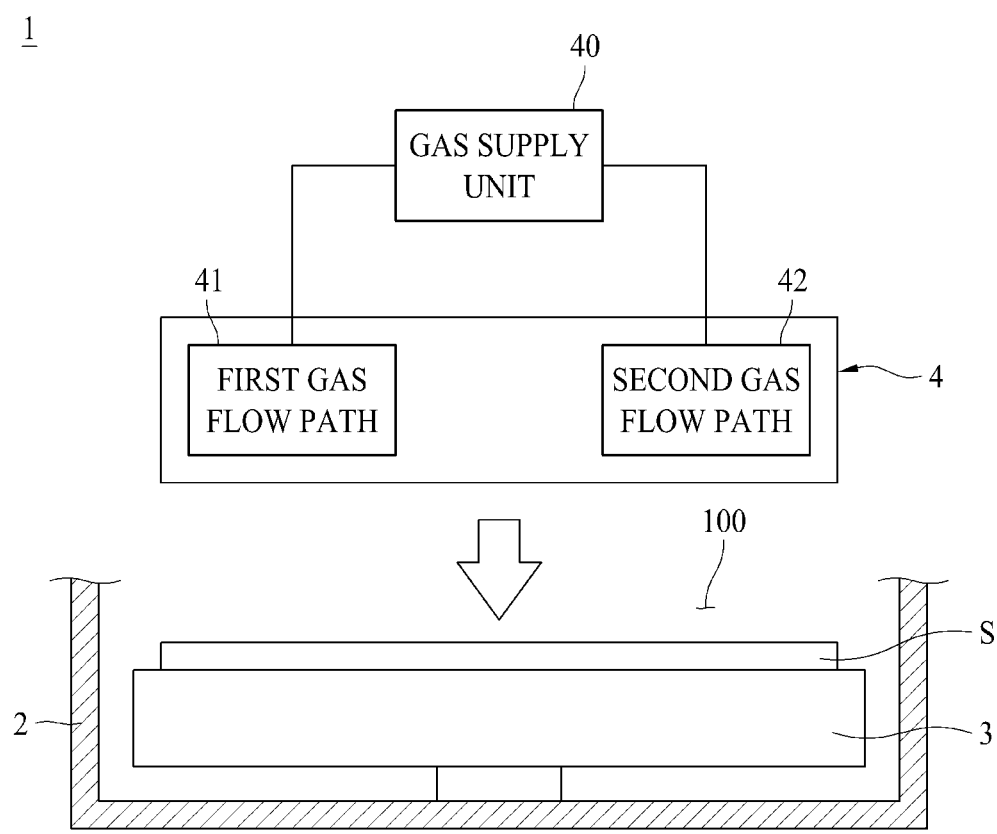
FIG. 1 is a schematic configuration diagram of a substrate processing apparatus according to the present inventive concept.
Figure 2:
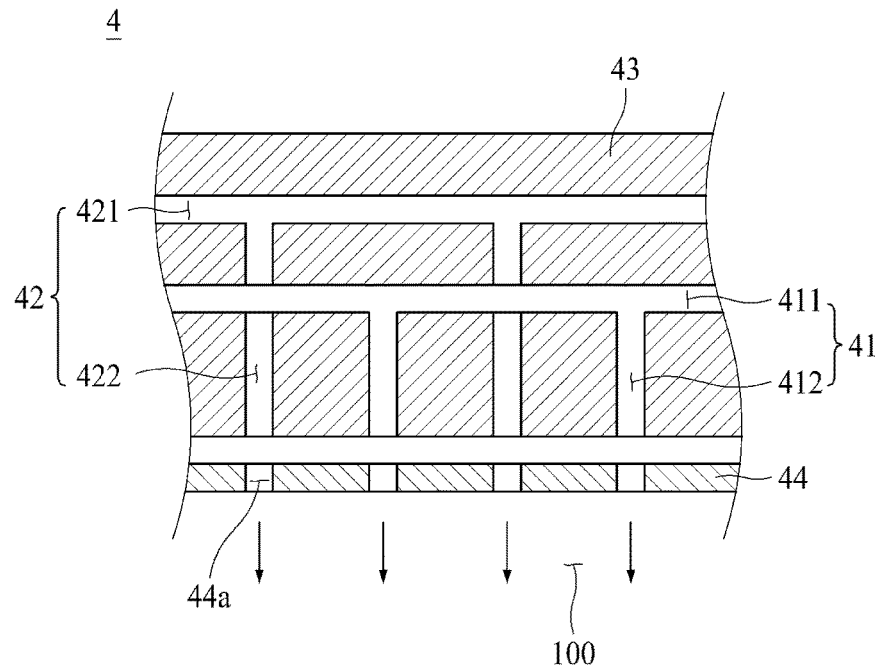
FIGS. 2 and 3 are schematic side cross-sectional views for describing embodiments of a gas injection unit in a substrate processing apparatus according to the present inventive concept.
Figure 3:
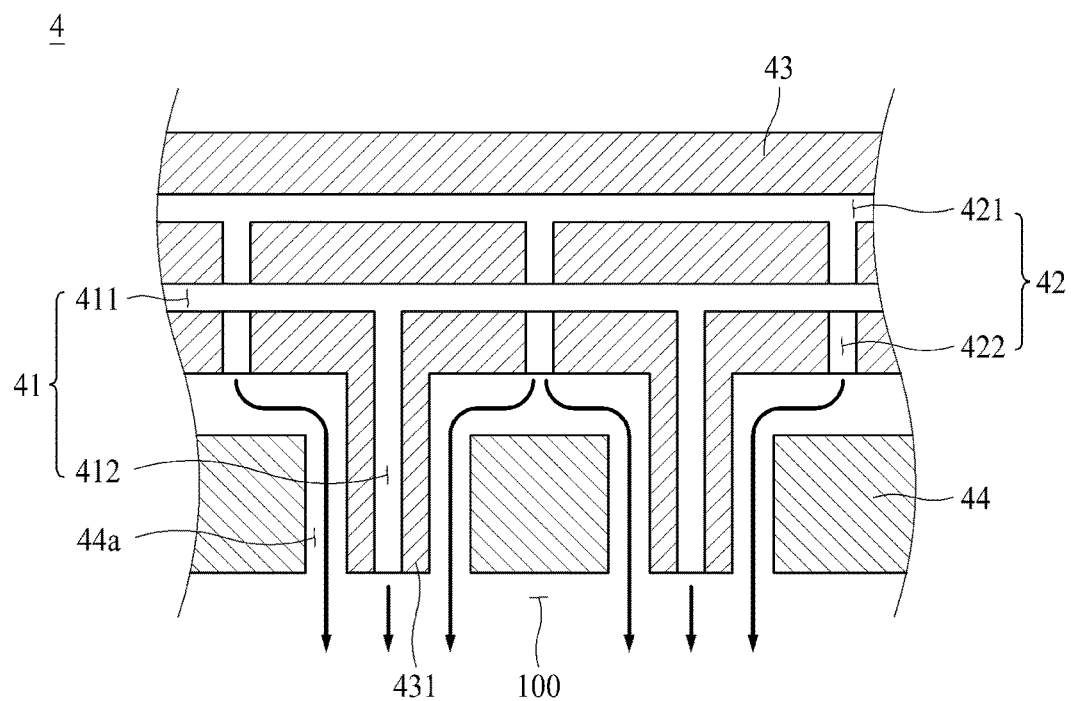
Figure 4:
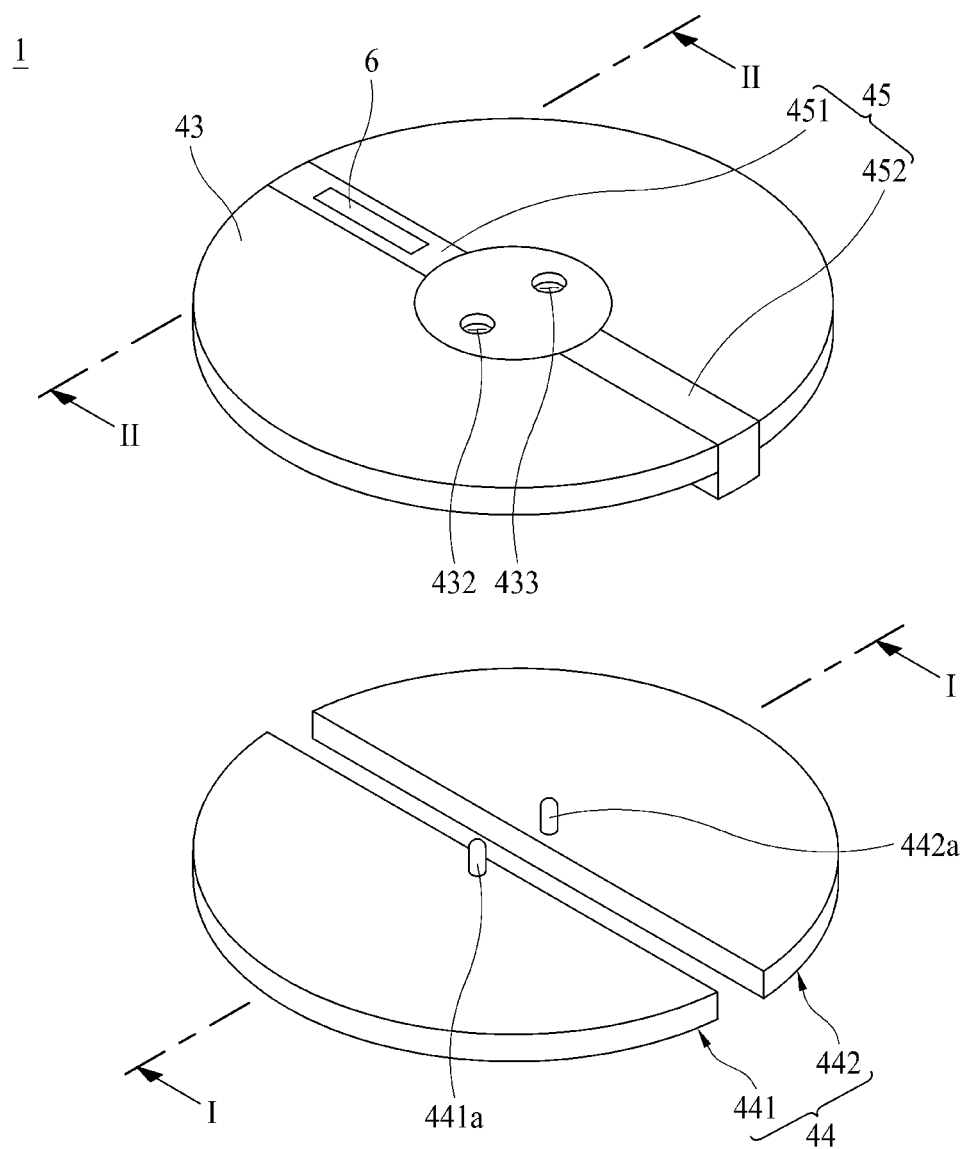
FIGS. 4 and 5 are schematic exploded perspective views of an upper electrode and a lower electrode in a substrate processing apparatus according to the present inventive concept.

Hereinafter, an embodiment of a substrate processing apparatus according to the present inventive concept will be described in detail with reference to the accompanying drawings. FIGS. 1 to 3 are schematic side cross-sectional views taken along line I-I of FIG. 4.

Referring to FIGS. 1 and 2, a substrate processing apparatus 1 according to the present inventive concept performs a processing process on a substrate S. The substrate S may be a glass substrate, a silicon substrate, a metal substrate, or the like. The substrate processing apparatus 1 according to the present inventive concept may perform a processing process such as a deposition process of depositing a thin film on the substrate S and an etching process of removing a portion of the thin film deposited on the substrate S. Hereinafter, an embodiment where the substrate processing apparatus 1 according to the present inventive concept performs the processing process will be mainly described, but it is obvious to those skilled in the art that an embodiment, where the substrate processing apparatus 1 according to the present inventive concept performs another processing process like the etching process, is deduced based thereon.

The substrate processing apparatus 1 according to the present inventive concept may include a chamber 2, a substrate supporting part 3, and a gas injection unit 4.

<Chamber>

Referring to FIG. 1, the chamber 2 provides a processing space 100. In the processing space 100, a processing process such as a deposition process or an etching process may be performed on the substrate S. The processing space 100 may be disposed in the chamber 2. An exhaust port (not shown) which exhausts a gas from the processing space 100 may be coupled to the chamber 2. The substrate supporting part 3 and the gas injection unit 4 may be installed in the chamber 2.

<Substrate Supporting Part>

Referring to FIG. 1, the substrate supporting part 3 supports the substrate S. The substrate supporting part 3 may support one substrate S, or may support a plurality of substrates S. In a case where the plurality of substrates S are supported by the substrate supporting part 3, a processing process may be performed on the plurality of substrates S at a time. The substrate supporting part 3 may be coupled to the chamber 2. The substrate supporting part 3 may be coupled to an inner portion of the chamber 2.

<Gas Injection unit>

Referring to FIG. 1, the gas injection unit 4 injects a gas toward the substrate supporting part 3. The gas injection unit 4 may be connected to a gas supply unit 40. Therefore, the gas injection unit 4 may inject a gas, supplied from the gas supply unit 40, toward the substrate supporting part 3. The gas injection unit 4 may be coupled to the chamber 2. The gas injection unit 4 may be disposed to be opposite to the substrate supporting part 3. The processing space 100 may be disposed between the gas injection unit 4 and the substrate supporting part 3. The gas injection unit 4 may be coupled to a lid. The lid is coupled to the chamber 2 to cover an upper portion of the chamber 2.

The gas injection unit 4 may include a first gas flow path 41 and a second gas flow path 42.

The first gas flow path 41 is for injecting a first gas. One side of the first gas flow path 41 may be connected to the gas supply unit 40 through a pipe or a hose. The other side of the first gas flow path 41 may communicate with the processing space 100. Therefore, the first gas supplied from the gas supply unit 40 may flow along the first gas flow path 41, and then, may be injected into the processing space 100 through the first gas flow path 41. The first gas flow path 41 may act as a path for enabling the first gas to flow and may act as an injection hole for injecting the first gas into the processing space 100.

The second gas flow path 42 is for injecting a second gas. The second gas and the first gas may be different gases. For example, when the first gas is a source gas, the second gas may be a reactant gas. One side of the second gas flow path 42 may be connected to the gas supply unit 40 through a pipe or a hose. The other side of the second gas flow path 42 may communicate with the processing space 100. Therefore, the second gas supplied from the gas supply unit 40 may flow along the second gas flow path 42, and then, may be injected into the processing space 100 through the second gas flow path 42. The second gas flow path 42 may act as a path for enabling the second gas to flow and may act as an injection hole for injecting the second gas into the processing space 100.

The second gas flow path 42 and the first gas flow path 41 may be disposed spatially apart from each other. Therefore, the second gas supplied from the gas supply unit 40 to the second gas flow path 42 may be injected into the processing space 100 without passing through the first gas flow path 41. The second gas supplied from the gas supply unit 40 to the first gas flow path 41 may be injected into the processing space 100 without passing through the second gas flow path 42. The second gas flow path 42 and the first gas flow path 41 may inject a gas toward different portions in the processing space 100.

Referring to FIGS. 2 and 3, the gas injection unit may include an upper electrode 43 and a lower electrode 44.

The upper electrode 43 may be disposed over the substrate supporting part 3 so as to be opposite to the substrate supporting part 3. The upper electrode 43 may be grounded, and thus, may act as a ground electrode. The upper electrode 43 may include the first gas flow path 41 and the second gas flow path 42. Accordingly, the upper electrode 43 may inject the first gas through the first gas flow path 41 and may inject the second gas through the second gas flow path 42. The first gas flow path 41 and the second gas flow path 42 may be disposed spatially apart from each other at a portion inward from the upper electrode 43.

The first gas flow path 41 may include a first connection hole 411 connected to the gas supply unit 40 and a plurality of first injection holes 412 connected to the first connection hole 411. The first connection hole 411 and the first injection holes 412 may be formed inward from the upper electrode 43. One side of each of the first injection holes 412 may communicate with the first connection hole 411, and the other side thereof may communicate with the processing space 100. Accordingly, the first gas supplied by the gas supply unit 40 may flow along the first connection hole 411, and then, may be injected into the processing space 100 through the first injection holes 412.

The second gas flow path 42 may include a second connection hole 421 connected to the gas supply unit 40 and a plurality of second injection holes 422 connected to the second connection hole 421. The second connection hole 421 and the second injection holes 422 may be formed inward from the upper electrode 43. One side of each of the second injection holes 422 may communicate with the second connection hole 421, and the other side thereof may communicate with the processing space 100. Accordingly, the second gas supplied by the gas supply unit 40 may flow along the second connection hole 421, and then, may be injected into the processing space 100 through the second injection holes 422.

The lower electrode 44 is disposed between the upper electrode 43 and the substrate supporting part 3. The lower electrode 44 may be apart from the upper electrode 43 and may be disposed under the upper electrode 43. An insulation member (not shown) for partial insulation may be disposed between the lower electrode 44 and the upper electrode 43. An RF power may be applied to the lower electrode 44. When the upper electrode 43 is grounded and the RF power is applied to the lower electrode 44, plasma may be generated. Accordingly, the gas injection unit 4 may activate a gas by using the plasma and may inject the activated gas into the processing space 100.

The lower electrode 44 may include a plurality of holes 44a. The plurality of holes 44a may be formed to pass through the lower electrode 44. The holes 44a may act as a path through which a gas injected from the upper electrode 43 passes.

As illustrated in FIG. 2, in a case where each of a bottom surface of the upper electrode 43 and a top surface of the lower electrode 44 is formed to be flat, some of the holes 44a may be disposed at a position corresponding to the first gas flow path 41, and thus, the first gas injected from the first gas flow path 41 may pass through the some holes 44a. The other holes 44a of the holes 44a may be disposed at a position corresponding to the second gas flow path 42, and thus, the second gas injected from the second gas flow path 42 may pass through the other holes 44a. Although not shown, fewer holes 44a than a sum of the number of first injection holes 412 of the first gas flow path 41 and the number of second injection holes 422 of the second gas flow path 42 may be formed.

As illustrated in FIG. 3, when the upper electrode 43 includes a plurality of protrusion electrodes 431, the holes 44a may be formed at positions respectively corresponding to the protrusion electrodes 431. The protrusion electrodes 431 may protrude to the substrate supporting part 3. The protrusion electrodes 431 may protrude from the bottom surface of the upper electrode 43 and may be respectively inserted into the holes 44a. The first gas flow path 41 may be provided in each of the protrusion electrodes 431. In this case, the first injection holes 412 may be formed so that one side of each of the first injection holes 412 is connected to the first connection hole 411 and the other side thereof passes through the protrusion electrodes 431.

Referring to FIGS. 1 to 5, the lower electrode 44 may include a first electrode 441 and a second electrode 442.

A first RF power is applied to the first electrode 441. The first RF power having a first frequency may be applied to the first electrode 441. The first electrode 441 may be electrically connected to a power application unit 5. The power application unit 5 may apply the first RF power having the first frequency to the first electrode 441. The first electrode 441 may be disposed in a first processing space 110 of the processing space 100.

A second RF power is applied to the second electrode 442. The second RF power having a second frequency may be applied to the second electrode 442. The second electrode 442 may be electrically connected to the power application unit 5. The power application unit 5 may apply the second RF power having the second frequency to the second electrode 442. The second electrode 442 may be disposed in a second processing space 120 of the processing space 100. Accordingly, the second electrode 442 and the first electrode 441 may be disposed at different positions in the processing space 100.

RF powers having different frequencies may be applied to the second electrode 442 and the first electrode 441. That is, the first frequency differs from the second frequency. Therefore, the substrate processing apparatus 1 according to the present inventive concept may perform a processing process on the substrate S by using the first RF power having the first frequency through the first electrode 441 and may perform a processing process on the substrate S by using the second RF power having the second frequency through the second electrode 442. Therefore, the substrate processing apparatus 1 according to the present inventive concept may be implemented so that a first thin film layer formed when a processing process is performed on the substrate S by using the first RF power having the first frequency and a second thin film layer, formed when a processing process is performed on the substrate S by using the second RF power having the second frequency, have different characteristics. Therefore, the substrate processing apparatus 1 according to the present inventive concept is implemented to enable the deposition of a thin film which has an advantage of each of the first thin film layer and the second thin film layer and where a disadvantage of each of the first thin film layer and the second thin film layer is complemented. Accordingly, the substrate processing apparatus 1 according to the present inventive concept may enhance the quality of a substrate S on which the processing process is completed.

The first frequency may be a frequency which is higher than the second frequency. In this case, the first frequency may be a relatively higher frequency than the second frequency, and the second frequency may be a relatively lower frequency than the first frequency. Therefore, when a processing process is performed on the substrate S by using the first RF power having the first frequency, a first thin film layer with an enhanced step coverage may be deposited. When a processing process is performed on the substrate S by using the second RF power having the second frequency, a second thin film layer with an enhanced dense degree may be deposited. As described above, the first thin film layer and the second thin film layer may be deposited, and thus, the substrate processing apparatus 1 according to the present inventive concept may deposit a thin film where all of a step coverage and a dense degree are good. Also, the substrate S may be upward or downward bent by applying a stress to the substrate S in a process of performing a processing process on the substrate S, and by using the first RF power having the first frequency and the second RF power having the second frequency, the substrate processing apparatus 1 according to the present inventive concept may decrease a stress applied to the substrate S. Therefore, the substrate processing apparatus 1 according to the present inventive concept may reduce the degree of bending deformation occurring in the substrate S, thereby more enhancing the quality of the substrate S on which the processing process is completed. For example, the first frequency may be 13.56 MHz or more and 100 MHz or less, and the second frequency may be 10 kHz or more and 4 MHz or less. For example, the first RF power of 1 kW or more and 5 kW or less may be applied to the first electrode 441, and the second RF power of 1 kW or more and 15 kW or less may be applied to the second electrode.

The second electrode 442 and the first electrode 441 may be formed to have the same area. Therefore, in each of a case where the second RF power having the second frequency is applied to the second electrode 442 and a case where the first RF power having the first frequency is applied to the first electrode 441, the efficiency of the processing process on the substrate S may be implemented to be approximately constant. An area of the second electrode 442 may be an area corresponding to a bottom surface of the second electrode 442 facing the substrate supporting part 3. An area of the first electrode 441 may be an area corresponding to a bottom surface of the first electrode 441 facing the substrate supporting part 3.

Here, the first electrode 441 may include a first connection projection 441a. The first connection projection 441a may protrude upward from a top surface of the first electrode 441. The first connection projection 441a may be inserted into a first through hole 432 which is formed in the upper electrode 43. The first through hole 432 is formed to pass through the upper electrode 43. Therefore, the first electrode 441 disposed under the upper electrode 43 and the power application unit 5 disposed over the upper electrode 43 may be electrically connected to each other through the first connection projection 441a inserted into the first through hole 432. Therefore, the substrate processing apparatus 1 according to the present inventive concept is implemented to apply the first RF power to the first electrode 441 while preventing short circuit from occurring in the upper electrode 43 which is grounded. Also, the power application unit 5 may be disposed over the upper electrode 43, and thus, the substrate processing apparatus 1 according to the present inventive concept may enhance the easiness of the arrangement of the power application unit 5. The power application unit 5 may be disposed outside the chamber 2. The power application unit 5 may include a first application mechanism 51 connected to the first electrode 441 so as to enable the first RF power to be applied to the first electrode 441. The first application mechanism 51 may be electrically connected to the first connection projection 441a inserted into the first through hole 432, and thus, may apply the first RF power having the first frequency to the first electrode 441 through the first connection projection 441a.

The first electrode 441 may be formed in a semicircular plate shape. In this case, the first connection projection 441a may be disposed adjacent to a center of the first electrode 441. Therefore, portions of the first electrode 441 disposed in different directions with respect to the center of the first electrode 441 may reduce a deviation occurring at a distance apart from the first connection projection 441a. Accordingly, the substrate processing apparatus 1 according to the present inventive concept may enhance the uniformity of the first RF power applied to the portions of the first electrode 441 which are disposed in different directions with respect to the center of the first electrode 441. The first connection projection 441a may be disposed at the center of the first electrode 441.

The second electrode 442 may include a second connection projection 442a. The second connection projection 442a may protrude upward from a top surface of the second electrode 442. The second connection projection 442a may be inserted into a second through hole 433 which is formed in the upper electrode 43. The second through hole 433 is formed to pass through the upper electrode 43 at a position apart from the first through hole 432. Therefore, the second electrode 442 disposed under the upper electrode 43 and the power application unit 5 disposed over the upper electrode 43 may be electrically connected to each other through the second connection projection 442a inserted into the second through hole 433. Therefore, the substrate processing apparatus 1 according to the present inventive concept is implemented to apply the second RF power to the second electrode 442 while preventing short circuit from occurring in the upper electrode 43 which is grounded. The power application unit 5 may include a second application mechanism 52 connected to the second electrode 442 so as to enable the second RF power to be applied to the second electrode 442. The second application mechanism 52 may be electrically connected to the second connection projection 442a inserted into the second through hole 433, and thus, may apply the second RF power having the second frequency to the second electrode 442 through the second connection projection 442a.

The second electrode 442 may be formed in a semicircular plate shape. In this case, the second connection projection 442a may be disposed adjacent to a center of the second electrode 442. Therefore, portions of the second electrode 442 disposed in different directions with respect to the center of the second electrode 442 may reduce a deviation occurring at a distance apart from the second connection projection 442a. Accordingly, the substrate processing apparatus 1 according to the present inventive concept may enhance the uniformity of the second RF power applied to the portions of the second electrode 442 which are disposed in different directions with respect to the center of the second electrode 442. The second connection projection 442a may be disposed at the center of the second electrode 442.

The second electrode 442 and the first electrode 441 may be disposed apart from each other. An insulator 45 may be disposed between the second electrode 442 and the first electrode 441. The insulator 45 may insulate the second electrode 442 from the first electrode 441. The insulator 45 may be coupled to the upper electrode 43. The insulator 45 may be coupled to the upper electrode 43 to protrude a portion under the upper electrode 43, and thus, may be disposed between the second electrode 442 and the first electrode 441. The insulator 45 may include a first insulation member 451 and a second insulation member 452. The first insulation member 451 and the second insulation member 452 may be disposed between the second electrode 442 and the first electrode 441 at different positions. The first insulation member 451 and the second insulation member 452 may be disposed apart from each other with respect to a center portion of the upper electrode 43.

Figure 6:
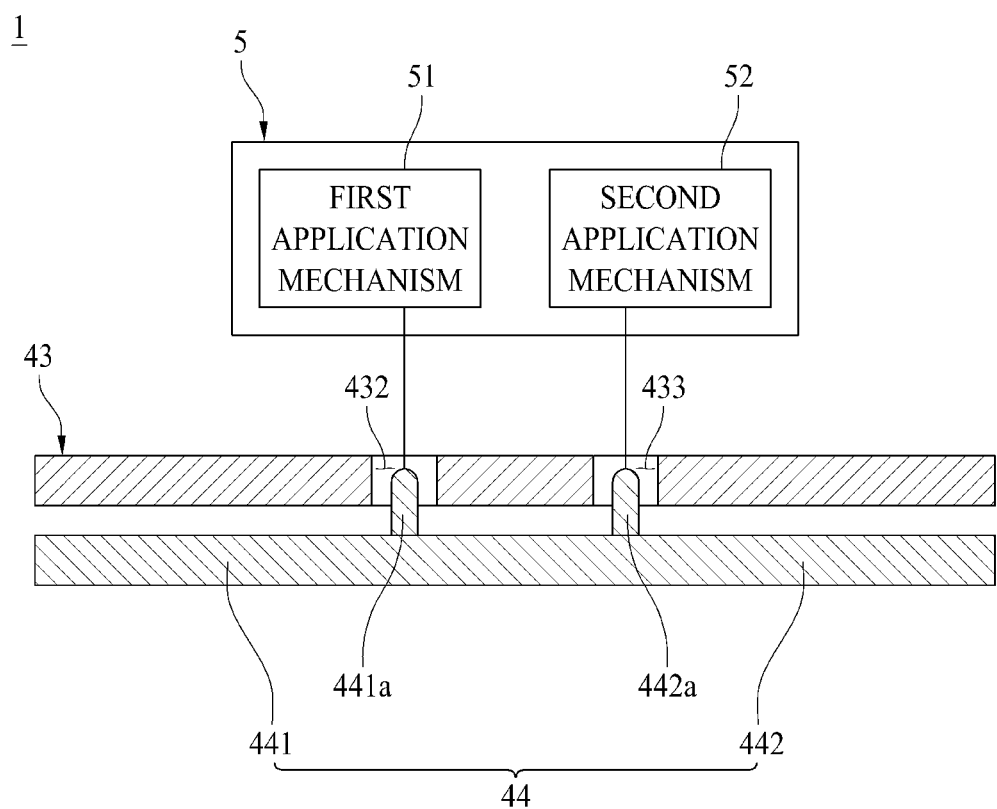
Figure 7:
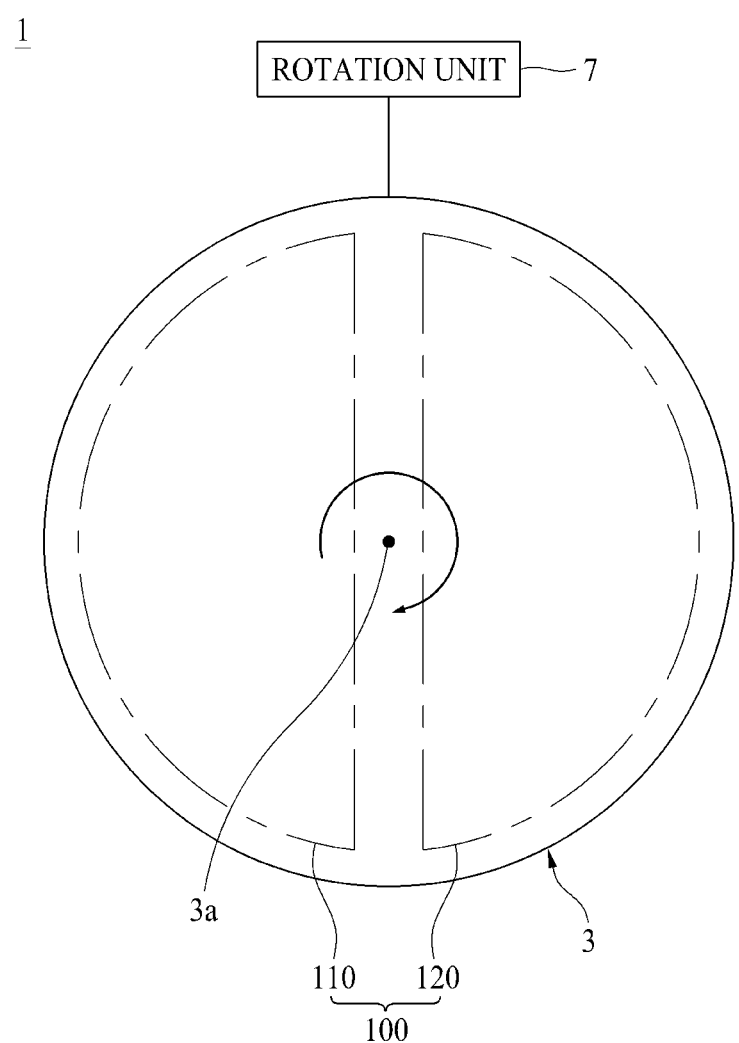
FIG. 7 is a schematic plan view of a substrate supporting part in a substrate processing apparatus according to the present inventive concept.
Figure 8:
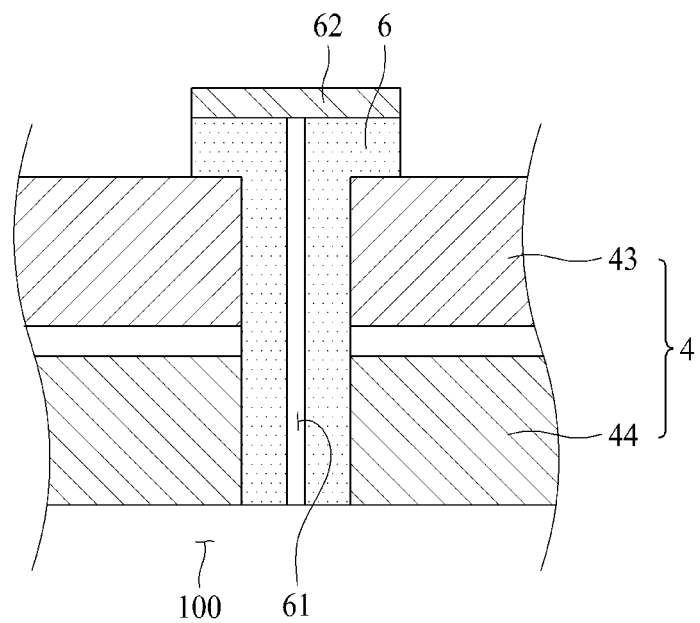
FIG. 8 is a schematic side cross-sectional view of an upper electrode and a lower electrode with respect to line II-II of FIG. 4.

As illustrated in FIG. 6, the second electrode 442 and the first electrode 441 may be formed as one body. Therefore, the lower electrode 44 may be implemented as one electrode. In this case, the power application unit 5 may selectively apply an RF power to the first electrode 441 and the second electrode 442 on the basis of a predetermined process sequence. The power application unit 5 may apply the first RF power having the first frequency to the first electrode 441 by using the first application mechanism 51. Therefore, the first RF power having the first frequency may be applied to the first electrode 441 and the second electrode 442, and thus, a processing process using the first RF power having the first frequency may be performed. In this case, the power application unit 5 does not apply the second RF power to the second electrode 442. The power application unit 5 may apply the second RF power having the second frequency to the second electrode 442 by using the second application mechanism 52. Therefore, the second RF power having the second frequency may be applied to the second electrode 442 and the first electrode 441, and thus, a processing process using the second RF power having the second frequency may be performed.

Figure 5:
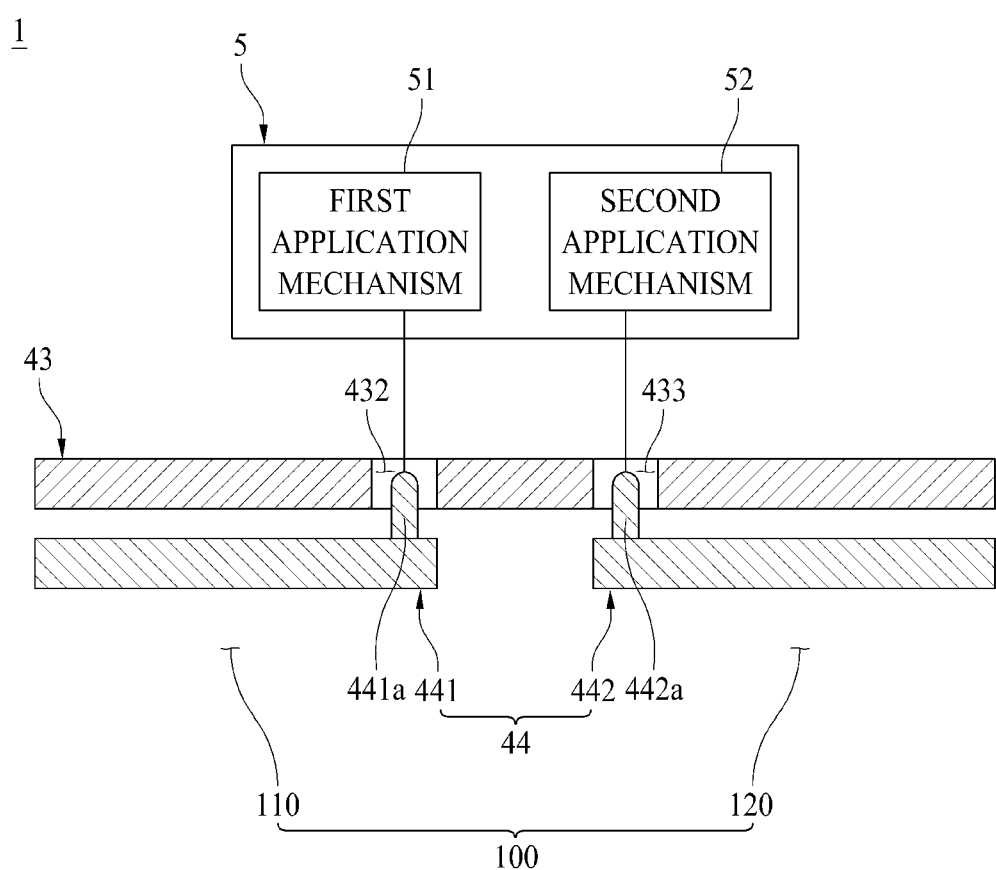

Moreover, as illustrated in FIG. 5, in a case where the second electrode 442 and the first electrode 441 are formed apart from each other, the power application unit 5 may apply the RF power to at least one of the first electrode 441 and the second electrode 442. The power application unit 5 may apply the first RF power having the first frequency to the first electrode 441 by using the first application mechanism 51 and may apply the second RF power having the second frequency to the second electrode 442 by using the second application mechanism 52. Therefore, a processing process using the first RF power having the first frequency may be performed in the first processing space 110, and a processing process using the second RF power having the second frequency may be performed in the second processing space 120. The power application unit 5 may apply the first RF power having the first frequency to the first electrode 441 by using the first application mechanism 51 and may not apply the second RF power to the second electrode 442 by using the second application mechanism 52. Also, the power application unit 5 may apply the second RF power having the second frequency to the second electrode 442 by using the second application mechanism 52 and may not apply the first RF power to the first electrode 441 by using the first application mechanism 51.

Referring to FIGS. 1 to 7, the substrate processing apparatus 1 according to the present inventive concept may include a rotation unit 7.

The rotation unit 7 rotates the substrate supporting part 3. The rotation unit 7 may rotate the substrate supporting part 3 with respect to a rotation shaft 3a to rotate a substrate S, supported by the substrate supporting part 3, with respect to the rotation shaft 3a. Therefore, the substrate S supported by the substrate supporting part 3 may pass through a region under the first electrode 441 and a region under the second electrode 442. Therefore, a processing process using the first frequency may be performed on the substrate S passing through the region under the first electrode 441, and a processing process using the second frequency may be performed on the substrate S passing through the region under the second electrode 442. That is, as the substrate S sequentially passes through the first processing space 110 and the second processing space 120, a processing process using RF powers having different frequencies may be performed on the substrate S. In this case, the power application unit 5 may apply the first RF power having the first frequency to the first electrode 441 and may apply the second RF power having the second frequency to the second electrode 442.

Moreover, in a case where the power application unit 5 applies the first RF power having the first frequency to the first electrode 441 and does not apply the second RF power to the second electrode 442, a processing process using the first frequency may be performed only when the substrate S supported by the substrate supporting part 3 passes through the region under the first electrode 441. In a case where the power application unit 5 applies the second RF power having the second frequency to the second electrode 442 and does not apply the first RF power to the first electrode 441, a processing process using the second frequency may be performed only when the substrate S supported by the substrate supporting part 3 passes through the region under the second electrode 442.

Referring to FIGS. 1 to 8, the substrate processing apparatus 1 according to the present inventive concept may include a detection unit 6.

The detection unit 6 is disposed to be inserted into all of the upper electrode 43 and the lower electrode 44. The detection unit 6 may be disposed between the first electrode 441 and the second electrode 442. A detection hole 61 may be formed in the detection unit 6. The detection hole 61 may be formed to pass through the detection unit 6. Therefore, the substrate processing apparatus 1 according to the present inventive concept is implemented to enable an inner portion of the chamber 2 to be checked through the detection hole 61 at the outside of the chamber 2. For example, the substrate processing apparatus 1 according to the present inventive concept may be implemented to detect, through the detection hole 61, a temperature of a substrate S passing through a region under the detection hole 61. The substrate processing apparatus 1 according to the present inventive concept may be implemented to detect, through the detection hole 61, the degree of deformation of the substrate S passing through the region under the detection hole 61. A transparent window 62 including the detection hole 61 may be coupled to an upper end of the detection unit 6.

The detection unit 6 may be inserted into the first insulation member 451. The detection unit 6 may be formed of an insulating material. In this case, the detection unit 6 may be implemented to have an insulation function of insulating the first electrode 441 from the second electrode 442 and have a detection function using the detection hole 61. In a case where the detection unit 6 is formed of an insulating material, the substrate processing apparatus 1 according to the present inventive concept may be implemented so that the detection unit 6 insulates the first electrode 441 from the second electrode 442 without the first insulation member 451.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. An apparatus for processing substrate, the apparatus comprising:
   a chamber;
   a substrate supporting part supporting one or more substrates in the chamber;
   an upper electrode disposed over the substrate supporting part so as to be opposite to the substrate supporting part; and
   a lower electrode disposed under the upper electrode so as to be apart from the upper electrode,
   wherein
   the upper electrode injects a first gas through a first gas flow path and injects a second gas through a second gas flow path spatially apart from the first gas flow path, and
   the lower electrode comprises:
   a first electrode to which only a first radio frequency (RF) power having a first frequency is applied; and
   a second electrode to which only a second RF power having a second frequency lower than the first frequency is applied.

2. The apparatus of claim 1, wherein the first electrode and the second electrode are formed to have the same area.

3. The apparatus of claim 1, wherein
   the first frequency is 13.56 MHz or more and 100 MHz or less, and
   the second frequency is 10 kHz or more and 4 MHz or less.

4. The apparatus of claim 1, wherein an insulator is disposed between the first electrode and the second electrode.

5. The apparatus of claim 1, wherein
the upper electrode comprises a plurality of protrusion electrodes protruding to the substrate supporting part, and
the first gas flow path is provided in each of the plurality of protrusion electrodes.

6. The apparatus of claim 5, wherein
a plurality of holes are formed in the lower electrode, and
the protrusion electrodes of the upper electrode are respectively inserted into the plurality of holes.

7. The apparatus of claim 1, comprising a rotation unit rotating the substrate supporting part,
wherein
the rotation unit rotates the substrate supporting part so that a substrate supported by the substrate supporting part passes through a region under the first electrode and a region under the second electrode,
a processing process using the first frequency is performed on a substrate passing through the region under the first electrode, and
a processing process using the second frequency is performed on a substrate passing through the region under the second electrode.

8. The apparatus of claim 1, wherein
the first RF power of 1 kW or more and 5 kW or less is applied to the first electrode, and
the second RF power of 1 kW or more and 15 kW or less is applied to the second electrode.

9. The apparatus of claim 1, comprising a first through hole formed to pass through the upper electrode, and a second through hole formed to pass through the upper electrode at a position apart from the first through hole,
wherein
the first electrode comprises a first connection projection inserted into the first through hole and is connected to a first application mechanism applying the first RF power through the first connection projection, and
the second electrode comprises a second connection projection inserted into the second through hole and is connected to a second application mechanism applying the second RF power through the second connection projection.

10. The apparatus of claim 7, comprising a detection unit disposed between the first electrode and the second electrode, and a detection hole formed to pass through the detection unit,
wherein
the detection unit is disposed to be inserted into all of the upper electrode and the lower electrode, and
the rotation unit rotates the substrate supporting part so that the substrate passes through a region under the detection hole.

11. An apparatus for processing substrate, the apparatus comprising:
a chamber;
a substrate supporting part supporting one or more substrates in the chamber;
a gas injection unit disposed over the substrate supporting part so as to be opposite to the substrate supporting part; and
a power application unit for applying a radio frequency (RF) power,
wherein
the gas injection unit comprises an upper electrode including a first gas flow path and a second gas flow path spatially apart from each other, and a lower electrode disposed between the upper electrode and the substrate supporting part,
the lower electrode comprises a first electrode and a second electrode disposed under the upper electrode, and
the power application unit comprises a first application mechanism connected to only the first electrode to apply a first RF power having a first frequency to the first electrode, and a second application mechanism connected to only the second electrode to apply a second RF power having a second frequency lower than the first frequency to the second electrode.

12. The apparatus of claim 11, wherein the power application unit applies the RF power to at least one of the first electrode and the second electrode.

* * * * *